(12) United States Patent
Bogel

(10) Patent No.: US 6,747,526 B1
(45) Date of Patent: Jun. 8, 2004

(54) 90° POWER DIVIDER

(75) Inventor: Thomas Bogel, Olbachstrasse (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/149,143

(22) PCT Filed: Nov. 10, 2000

(86) PCT No.: PCT/EP00/11141

§ 371 (c)(1),
(2), (4) Date: Sep. 24, 2002

(87) PCT Pub. No.: WO01/43283

PCT Pub. Date: Jun. 14, 2001

(30) Foreign Application Priority Data

Dec. 9, 1999 (DE) .......................... 199 59 406

(51) Int. Cl.[7] ................................. H03H 7/48
(52) U.S. Cl. ....................... 333/125; 333/117
(58) Field of Search ............... 333/117, 118, 333/136, 172, 124, 125, 126, 127, 128

(56) References Cited

U.S. PATENT DOCUMENTS

| 4,464,791 | A | * | 8/1984 | Eness | .......................... 455/506 |
| 5,155,495 | A | * | 10/1992 | Hately et al. | ................ 343/725 |
| 5,610,940 | A | * | 3/1997 | Durrant et al. | ............. 375/150 |
| 5,644,260 | A | | 7/1997 | DaSilva et al. | |
| 5,694,093 | A | | 12/1997 | DaSilva et al. | |
| 5,739,723 | A | * | 4/1998 | Sigmon et al. | ............. 330/295 |
| 6,078,299 | A | * | 6/2000 | Scharfe, Jr. | .................. 343/858 |

FOREIGN PATENT DOCUMENTS

| DE | 1513950 | 10/1969 | |
| JP | 06268550 | 5/1996 | ............ H03H/7/21 |

* cited by examiner

*Primary Examiner*—Robert Pascal
*Assistant Examiner*—Dean Takaoka
(74) *Attorney, Agent, or Firm*—Lewis, Rice & Fingersh, LC

(57) ABSTRACT

The invention relates to a 90° power divider for distributing the power of an input signal (E) to two output branches (A1, A2) that are phase-shifted against each other by 90°. A capacity (C) is arranged in one output branch (A1) and an inductivity (L) is arranged in the remaining output branch (A2). Said capacity and inductivity are measured as follows: $C=\frac{1}{2}*\pi*Z1*Fo$, $L=Z2/2*\pi*Fo$, whereby Fo is the centre frequency and Z1 and Z2 are the terminating resistances of the output branches (A1, A2) respectively.

7 Claims, 2 Drawing Sheets

90° POWER DIVIDER

BACKGROUND OF THE INVENTION

1. Field of the Invention

The invention relates to a 90° power divider.

2. Description of the Prior Art

Power dividers of this kind are known. They have been produced to date in the form of directional couplers, hybrid coupler or similar coupler circuits, for example with transformers. These known power dividers are complicated and expensive.

SUMMARY

It is the object of the invention to create a 90° power divider, which can be produced very simply and cheaply.

This object is achieved based on a 90° power divider according to the preamble of the main claim by its characterising features. Advantageous further developments emerge from the subordinate claims.

A 90° power divider according to the invention can be produced very simply by means of a capacitor and a coil and it additionally has the advantage that it can be very highly driven, which is important in particular in its application in radio transmitters. It has further proved particularly advantageous to use a 90° power divider of this kind with an I/Q modulator, I/Q demodulator or a quadrature mixer for generating the two I and Q components phase-shifted against each other by 90°. It can equally well be used for in-phase adding.

DETAILED DESCRIPTION OF EMBODIMENTS OF THE INVENTION

The invention is described in greater detail below by embodiment examples using schematic drawings.

Figure 1:
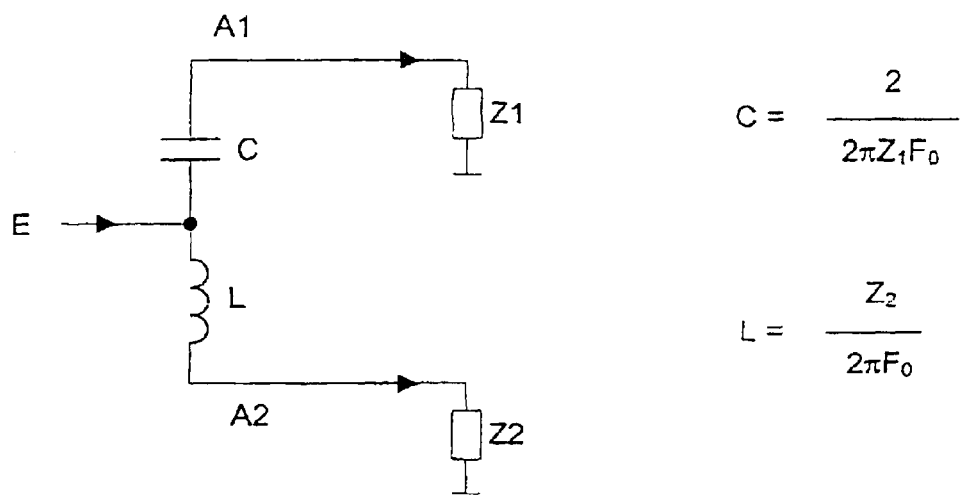
FIG. 1 shows the basic circuit diagram of a 90° power divider according to the invention, consisting of a capacitor C and an inductivity L.

FIG. 1 shows the basic circuit diagram of a 90° power divider according to the invention, consisting of a capacitor C and an inductivity L. At the input E an input signal is supplied which is to be distributed to the two output branches A1 and A2, which are terminated in each case by a load Z1 or Z2. For distributing the power of the input signal E in equal parts, to the two loads Z1 and Z2 with a mutual phase shift of 90° the following relation applies to the dimensioning of the capacitor C and the inductivity L:

$$C = \frac{1}{2*\pi*Z_1*Fo}$$
$$L = \frac{Z_2}{2*\pi*Fo}$$

Fo is therein the operating frequency. Advantageously the two load resistances Z1 and Z2 are chosen as of equal size, corresponding to the system impedance preferably 50 ohms. In this way it is achieved that power adaptation also prevails at the input E.

By means of the arrangement according to the invention it is achieved that the capacitive branch is leading by +45° and the inductive branch is lagging by −45°. From this emerges a differential phase of 90° between port 2 and port 3. This differential phase is maintained over a wide frequency range. If the frequency range diverges too far from the centre frequency Fo, the power is no longer distributed in equal parts. With increasing frequency the capacitive branch takes up more power and with falling frequency the inductive branch takes up more power. If a difference of 1 dB is allowed between A1 and A2 as a permissible difference in power, the arrangement can be operated over a bandwidth of approximately 28%. The relation between the centre frequency and the frequency limits is as follows:

For $Fo: Fo=\sqrt{Fmin*Fmax}$ applies.

Since C and L represent complementary elements, the input impedances of the two load branches compensate one another in that the parallel circuit of the two branches again makes the charge impedance Z appear at the input. This ensures good adaptation at the input.

Figure 2:
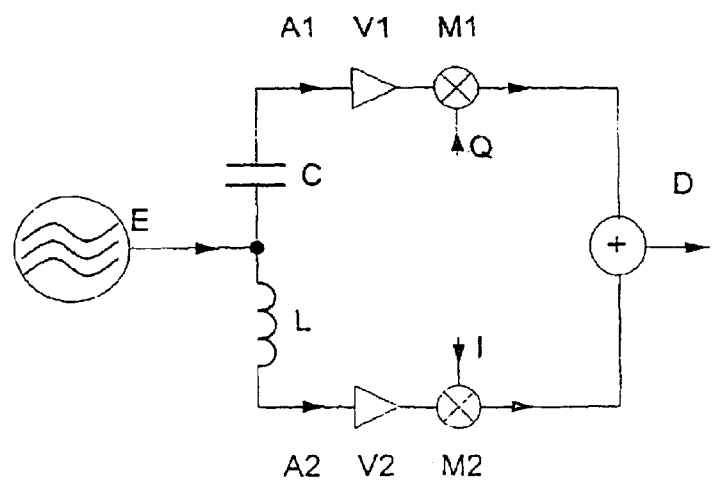
FIG. 2 shows a basic circuit diagram of an I/Q modulator of an embodiment of the invention in which the carrier as input signal is divided via a capacitor C and an inductivity L into carrier signals phase-shifted against each other by 90°, which are then supplied via amplifiers V1 or V2 to the mixers M1 or M2 of the I/Q modulator, in which they are multiplied by the I and Q components.

The power divider according to the invention is eminently suitable for the construction of I/Q modulators, I/Q demodulators or so-called quadrature mixers, as in this way expenditure on circuits of this kind is considerably reduced compared with conventional solutions and the power dividers can additionally be very highly driven. In this way I/Q modulators can be constructed which, for example, can be directly looped into the signal branch of a transmitter processing. The high signal-to-noise ratio needed for many high frequency transmitters can therefore usually be achieved without problems. FIG. 2 shows the basic circuit diagram of an I/Q modulator of this kind, in which the carrier as input signal is again divided via a capacitor C and an inductivity L into carrier signals phase-shifted against each other by 90°, which are then supplied via amplifiers V1 or V2 to the mixers M1 or M2 of the I/Q modulator, in which they are multiplied by the I and Q components. The thus generated output signals are then combined in an adder D into a single output signal, which is then further processed. The additional amplifiers V1 and V2 increase the level before the mixers M1 and M2, which improves the signal-to-noise ratio of the output signal. At the same time these amplifiers represent a load, independent of modulation, for the power divider, as they decouple the input impedance which in many mixers is dependent on drive.

The I and Q components can also, of course, be generated by a 90° power divider according to the invention in the same way.

Figure 3:
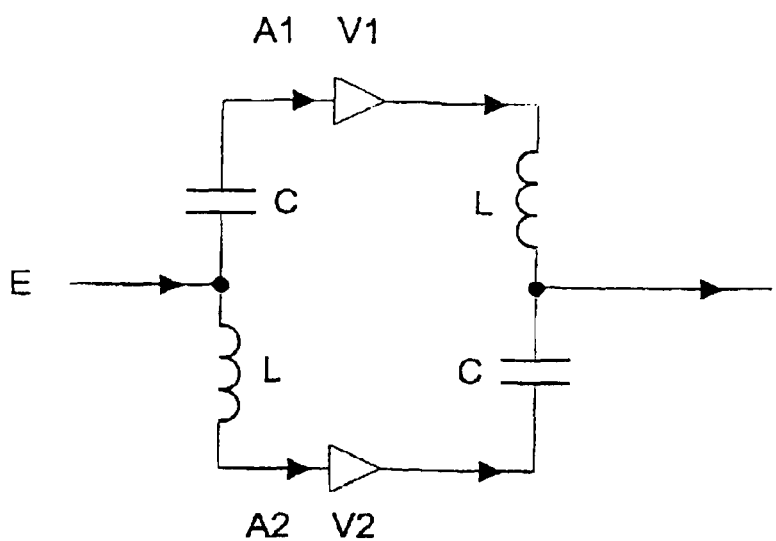
FIG. 3 shows a 90° power divider according to the invention that is suitable for connecting two amplifier stages in parallel in order to increase the achievable output power.

A 90° power divider according to the invention is also very suitable for connecting two amplifier stages in parallel, in order to increase the achievable output power, as shown in FIG. 3. For this purpose in each of the two branches A1 and A2 after the power divider L, C an amplifier V1, V2 is arranged in each case and the output signals of these two amplifiers V1 and V2 are combined with a further circuit consisting of an inductivity L and a capacitor C, which corresponds to the 90° power divider on the input side. The inductivity L and the capacitor C on the output side are, however, constructed to mirror the arrangement of the power divider at the input, so the desired in-phase summation is achieved at the output. This circuit for increasing power is particularly suitable for connecting together so-called MMICs, as these are normally adapted internally to 50 ohms and thus suit this kind of power divider. If the drop in power at the limits of the usable bandwidth and certain losses are taken into account, with an arrangement of this kind a drive 2 dB higher than with a single amplifier can be achieved.

What is claimed is:

1. 90° power divider for distributing the power of an input signal (E) to two output branches (A1, A2) phase-shifted against each other by 90°, characterised in that in one output branch (A1) a capacity C and in the other output branch (A2) an inductivity L is arranged, with dimensions as follows:

$$C = \frac{1}{2*\pi*Z_1*Fo}$$

$$L = \frac{Z_2}{2*\pi*Fo}$$

wherein Fo is the centre frequency and Z1 and Z2 are in each case the terminating resistances of the output branches (A1, A2).

2. 90° power divider according to claim 1, characterised in that the two output branches (A1, A2) are terminated in each case with the same impedance (Z).

3. 90° power divider according to claim 1 or 2, characterised by its application in an I/Q modulator, I/Q demodulator or a quadrature mixer.

4. 90° power divider according to claim 1 or 2, characterised by its application for parallel connection on the input and output side of two individual amplifier stages (V1, V2), wherein the capacitors C and inductivities L are connected at the input or output in each case as mirrored to one another.

5. 90° power divider for distributing the power of an input signal (E) to two output branches (A1, A2) phase-shifted against each other by 90°, characterised in that in one output branch (A1) a capacity C and in the other output branch (A2) an inductivity L is arranged, with dimensions as follows:

$$C = \frac{1}{2*\pi*Z_1*Fo}$$

$$L = \frac{Z_2}{2*\pi*Fo}$$

and further characterised in that in the two output branches (A1, A2) in each case an amplifier (V1, V2) is arranged in series to the capacitor C or the inductivity L, wherein Fo is the centre frequency and Z1 and Z2 are in each case the terminating resistances of the output branches (A1, A2).

6. 90° power,divider according to claim 5, further characterised in that the two output branches (A1, A2) are terminated in each case with the same impedance (Z).

7. 90° power divider according to claim 5 or 6, further characterised by its application in an I/Q modulator, I/Q demodulator or a quadrature mixer.

* * * * *